(12) United States Patent
Smith

(10) Patent No.: US 7,956,531 B2
(45) Date of Patent: Jun. 7, 2011

(54) DISPLAY DEVICE HAVING A PLURALITY OF PIXELS EACH COMPRISING SUB-PIXELS

(75) Inventor: Euan C. Smith, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 1001 days.

(21) Appl. No.: 10/587,602

(22) PCT Filed: Jan. 24, 2005

(86) PCT No.: PCT/GB2005/000233
§ 371 (c)(1),
(2), (4) Date: Apr. 10, 2007

(87) PCT Pub. No.: WO2005/074327
PCT Pub. Date: Aug. 11, 2005

(65) Prior Publication Data
US 2007/0216610 A1    Sep. 20, 2007

(30) Foreign Application Priority Data
Jan. 30, 2004    (GB) .................................. 0401999.8

(51) Int. Cl.
*G09G 3/30* (2006.01)
(52) U.S. Cl. .................... 313/505; 345/76; 315/169.3
(58) Field of Classification Search .................. 313/503; 315/169.3; 345/76
See application file for complete search history.

(56) References Cited

U.S. PATENT DOCUMENTS

| | | | |
|---|---|---|---|
| 4,539,507 A | 9/1985 | VanSlyke et al. | 313/504 |
| 6,107,734 A | 8/2000 | Tanaka et al. | 313/506 |
| 6,693,296 B1 * | 2/2004 | Tyan | 257/40 |
| 6,798,148 B2 * | 9/2004 | Inukai | 315/169.3 |
| 7,227,305 B2 * | 6/2007 | Liu et al. | 313/506 |
| 7,612,499 B2 * | 11/2009 | Tsujimura et al. | 313/506 |
| 7,635,863 B2 * | 12/2009 | Yamazaki et al. | 257/59 |
| 2003/0117348 A1 | 6/2003 | Knapp et al. | 345/76 |

(Continued)

FOREIGN PATENT DOCUMENTS

EP    717 446 A2    6/1996

(Continued)

OTHER PUBLICATIONS

"Very High-Efficiency Green Organic Light-Emitting Devices Based on Electrophosphorescence", Baldo et al., Applied Physics Letters, vol. 75, No. 1, Jul. 1999, pp. 4-6.

(Continued)

*Primary Examiner* — Peter Macchiarolo
(74) *Attorney, Agent, or Firm* — Marshall, Gerstein & Borun LLP

(57) ABSTRACT

An organic light emitting diode (OLED) display device is described, the display device having a plurality of pixels each comprising at least two sub-pixels of different types, a first sub-pixel type comprising an OLED device including a first type of OLED material and a second sub-pixel type comprising an OLED device including a second type of OLED material, and wherein at least one of said first and second types of sub-pixel comprises a plurality of series-connected OLED devices. Employing series-connected sub-pixels where different types of OLED material are used for a display such as a color, active matrix OLED display facilitates balancing sub-pixel drive voltages and hence enables the production of display devices with improved efficiency.

11 Claims, 5 Drawing Sheets

U.S. PATENT DOCUMENTS

| | | |
|---|---|---|
| 2003/0189401 A1 | 10/2003 | Kido et al. .................... 313/504 |
| 2005/0007320 A1 | 1/2005 | Smith et al. ..................... 345/77 |
| 2005/0030304 A1* | 2/2005 | Inukai ........................... 345/204 |
| 2008/0218061 A1* | 9/2008 | Chao et al. .................... 313/504 |

FOREIGN PATENT DOCUMENTS

| | | |
|---|---|---|
| EP | 1 351 558 | 10/2003 |
| GB | 2 381 643 | 5/2003 |
| JP | 2000-29404 | 1/2000 |
| JP | 2000-89691 | 3/2000 |
| JP | 2000089691 | 3/2000 |
| WO | WO 90/13148 | 11/1990 |
| WO | WO 95/06400 | 3/1995 |
| WO | WO 99/42983 | 8/1999 |
| WO | WO 99/48160 | 9/1999 |
| WO | WO 02/066552 A1 | 8/2002 |

OTHER PUBLICATIONS

International Search Report in PCT/GB2005/000233 dated May 12, 2005.

Search Report in GB0401999.8 dated May 27, 2004.

International Preliminary Report on Patentability for International Application No. PCT/GB2005/000233 dated Jul. 31, 2006.

* cited by examiner

DISPLAY DEVICE HAVING A PLURALITY OF PIXELS EACH COMPRISING SUB-PIXELS

BACKGROUND OF THE INVENTION

1. Field of the Invention

This invention relates to improved organic light emitting diode (OLED) display devices, and in particular to increased efficiency color display devices.

2. Related Technology

Organic light emitting diodes (OLEDs) comprise a particularly advantageous form of electro-optic display. They are bright, colorful, fast-switching, provide a wide viewing angle and are easy and cheap to fabricate on a variety of substrates. Organic LEDs may be fabricated using either polymers or small molecules in a range of colors (or in multi-colored displays), depending upon the materials used. Examples of polymer-based organic LEDs are described in WO 90/13148, WO 95/06400 and WO 99/48160; examples of so called small molecule based devices are described in U.S. Pat. No. 4,539,507.

A basic structure 100 of a typical organic LED is shown in FIG. 1. A glass or plastic substrate 102 supports a transparent anode layer 104 comprising, for example, indium tin oxide (ITO) on which is deposited a hole transport layer 106, an electroluminescent layer 108, and a cathode 110. The electroluminescent layer 108 may comprise, for example, PPV (poly(p-phenylenevinylene)) and the hole transport layer 106, which helps match the hole energy levels of the anode layer 104 and electroluminescent layer 108, may comprise, for example, PEDOT:PSS (polystyrene-sulphonate-doped polyethylene-dioxythiophene). Cathode layer 110 typically comprises a low work function metal such as calcium and may include an additional layer, such as a layer of aluminium. Contact wires 114 and 116 to the anode the cathode respectively provide a connection to a power source 118. The same basic structure may also be employed for small molecule devices.

In the example shown in FIG. 1 light 120 is emitted through transparent anode 104 and substrate 102 and such devices are referred to as "bottom emitters". Devices which emit through the cathode may also be constructed, for example by keeping the thickness of cathode layer 110 less than around 50-100 nm so that the cathode is substantially transparent.

Organic LEDs may be deposited on a substrate in a matrix of pixels to form a single or multi-color pixelated display. A multi-colored display may be constructed using groups of red, green, and blue emitting pixels. In such displays the individual elements are generally addressed by activating row (or column) lines to select the pixels, and rows (or columns) of pixels are written to, to create a display. It will be appreciated that with such an arrangement it is desirable to have a memory element associated with each pixel so that the data written to a pixel is retained whilst other pixels are addressed. Generally this is achieved by a storage capacitor which stores a voltage set on a gate of a driver transistor. Such devices are referred to as active matrix displays and examples of polymer and small-molecule active matrix display drivers can be found in WO 99/42983 and EP 0,717,446A respectively.

It is usual to provide a current-controlled rather than a voltage-controlled drive to an OLED because the brightness of an OLED is determined by the current flowing through the device, this determining the number of photons it generates. In a voltage-controlled configuration the brightness can vary across the area of a display and with time, temperature, and age, making it difficult to predict how bright a pixel will appear when driven by a given voltage. In a color display the accuracy of color representations may also be affected.

FIG. 2a shows an example of a current-controlled pixel driver circuit 220 in which the current through an OLED 216 is set by using a reference current sink 220 to set a drain source current for an OLED driver transistor 212 (which in this example also flows through a switching transistor 214). The circuit memorizes the driver transistor gate voltage required for this drain-source current with a capacitor 218. Thus the brightness of the OLED 216 is determined by the current, $I_{col}$, flowing into an adjustable reference current sink 220, which is set as desired for the pixel being addressed. One current sink 220 is provided for each column data line. In the illustrated circuit all the transistors are PMOS (although NMOS transistors may also be used) and thus the source connections are towards GND and $V_{ss}$ is negative.

FIG. 2b shows a display driver for an active matrix display 202. In FIG. 2b the active matrix display 202 has a plurality of row electrodes 204a-e and a plurality of column electrodes 208a-e each connecting to internal respective row and column lines 206, 210 (for clarity, only two are shown). Power ($V_{ss}$) and ground connections are provided to provide power to the pixels of the display. A pixel 200 is connected to the $V_{ss}$, ground, row and column lines. In practice a plurality of pixels is provided generally, but not necessarily, arranged in a rectangular grid and addressed by the row and column electrodes 204, 208. The active matrix pixel 200 may comprise any conventional active matrix pixel driver circuit, such as the circuit of FIG. 2a.

The row and column electrodes 204, 208 are driven by row and column drivers 230, 234 controlled by a display drive logic 246. As illustrated each column electrode is driven by an adjustable constant current generator 240, in turn controlled by a data output 236 from a display device logic 246, (for clarity only one is shown). In a voltage-controlled display voltage rather than current drivers may be employed.

In operation each row of active matrix display 202 is selected in turn using row electrodes 204 and, for each row, the brightness of each pixel in a row is set by the driving column electrodes 208 with brightness data comprising either a current or a voltage. The active matrix pixels including a memory element, generally a capacitor, to keep a row illuminated even when not selected and thus once data has been written to the display, it only needs to be updated with changes to the pixels. Power to the display is provided by a battery 224 and a power supply unit 222 to provide a regulated $V_{ss}$ output 228.

There are many types of OLED pixel driver circuits, for example the improved pixel driver circuits described in UK patent application GB2,381,643. However for the purposes of the following discussion, to illustrate problems common to these driving arrangements, and also to voltage-controlled driver circuits, the simplified circuit model of FIG. 3a is employed.

FIG. 3a shows one pixel 300 of an active matrix color OLED display and its associated drive circuitry. This is reproduced for each pixel of the display. The pixel comprises three sub-pixels 300a, b, c emitting in the red, green, and blue portions of the visible spectrum respectively. Each sub-pixel comprises an OLED 302a, b, c and an associated drive transistor 304a, b, c, typically a thin film transistor; the remainder of the sub-pixel addressing and drive circuitry is not shown. Each of the three sub-pixels and their associated driver transistors are connected between common supply (in this case, $V_{ss}$) and ground lines. In general these are common for all the pixels of an active matrix display.

FIG. 3b shows a view from above of a display face of an active matrix color display 310 comprising a plurality of pixels 300 and FIG. 3c shows an enlargement of FIG. 3b showing details of a single pixel 300. In this example the red, green, and blue OLEDs 302a, b, c of the sub-pixels 300 a, b, c are formed as three adjacent vertical stripes but it will be appreciated that many other geometrical configurations are possible. Broadly speaking in cross section the display is similar to that shown in FIG. 1 but includes an additional semi-conductor layer or layers immediately adjacent the glass substrate in which the driver circuitry is formed.

For simplicity in FIG. 3c the driver circuitry has been omitted although, in practice, this occupies a portion of the area of each pixel. An aperture ratio may be defined as the active area of the pixel (or sub-pixel) divided by the total available pixel area. Thus in a color display aperture ratios are generally defined such that the sum of the aperture ratio of each sub-pixel equals the total aperture ratio.

Referring again to FIG. 3a, the efficiency of the pixel, that is of the OLED and driver combination, is determined by the intrinsic efficiency of the OLED, usually measured in candelas per amp (cd/A) and by the losses in the OLED drive transistors. These are preferably operated in saturation, and the power supply voltage (in the above example, $V_{ss}$) is chosen such that when the voltage drop across the driver transistor is taken into account the power supply is just sufficient to drive an OLED at the maximum desired brightness. However in a similar way to a conventional silicon diode once a 'turn-on' voltage has been reached only a small additional increase in voltage causes a rapid increase in current through the device so that a drive voltage of an OLED only varies a little with the current through the device and may be considered to be approximately constant. (This is why the drivers in an active matrix pixel such as pixel 300 of FIG. 3a generally provide a controlled current source or sink.)

The configuration of FIG. 3a is convenient but a problem arises when the red, green and blue OLEDs 302a, b, c have very different drive voltages. This can occur when all three OLEDs are fabricated from light emitting polymer, when the blue voltage in particular tends to be significantly higher than the red voltage. However the problem is particularly acute when different classes of material are employed for the different color OLEDs. Thus small-molecule OLEDs tend to require a significantly higher drive voltage than light emitting polymer (LEP)-based devices. In particular, phosphorescent light emitting small molecules tend to have a significantly greater intrinsic efficiency than polymer OLEDs but also tend to require a higher drive voltage. An example of iridium phenylpyridine phosphorescent complexes is described in "Very high-efficiency green organic light-emitting devices based on electrophosphorescence" M. A. Baldo, S. Lamansky, P. E. Burrows, M. E. Thompson, and S. R. Forrest Applied Physics Letters Vol 75(1) pp. 4-6. Jul. 5, 1999.

A green emitting phosphorescent-based OLED may exhibit a maximum efficiency of, say, 55 cd/A; a blue LEP-based fluorescent OLED may have an efficiency of only around 12 cd/A. These variations in efficiency in part arise from the mode of light emission, that is whether this is primarily fluorescence which relies on singlet excitons, or primarily phosphorescence which additionally utilises triplet excitons leading to increased efficiency.

Light emitting dendrimers comprise a further class of light emitting materials. Light emitting dendrimers comprise a light emitting core surrounded by branched molecular chains termed dendrons. A particularly useful class of phosphorescent light emitting dendrimers is disclosed in WO02/066552.

To create an increased efficiency OLED display it is desirable to be able to combine OLEDs fabricated from different classes of material, such as a dendritic phosphorescent green emitter, a polymer-based blue emitter, and a dendritic phosphorescent or polymer-based red emitter. However although dendritic phosphorescent materials are more efficient than fluorescent systems (both polymers and small molecules), when they are combined with fluorescent materials in a display the overall higher drive voltage required, and hence increased driver losses as described further below, makes the overall display less efficient. For example a green dendritic phosphorescent emitter requires a drive voltage of approximately 7 volts and with, say, four volts dropped across a drive transistor in saturation this dictates a minimum supply voltage of approximately 11 volts. However the drive voltage of blue and red LEP-based devices might only be, say, four volts and three volts respectively. Thus in this example there is a power loss in the blue sub-pixel of three volts times the drive current and in the red sub-pixel four volts times the drive current.

JP2000-089691 describes the series connection of OLEDs to improve power consumption but does not address the problems which arise where light emitting molecules having substantially different drive voltages are used in a display. JP2000-029404 also describes the series connection of organic electroluminescent elements, but to reduce the impact of a short within an element (which would otherwise cause a pixel to go dark) rather than in connection with the above described problem.

GENERAL DESCRIPTION OF THE INVENTION

The invention seeks to alleviate the above mentioned difficulties which arise in displays such as color displays in which sub-pixels fabricated from different types of OLED material, for example to emit at different wavelengths, require different drive voltages, thus reducing the overall efficiency of the display.

According to a first aspect of the invention there is therefore provided an organic light emitting diode (OLED) display device, the display device having a plurality of pixels each comprising at least two sub-pixels of different types, a first sub-pixel type comprising an OLED device including a first type of OLED material and a second sub-pixel type comprising an OLED device including a second type of OLED material, and wherein at least one of said first and second types of sub-pixel comprises a plurality of series-connected OLED devices.

Connecting the OLED devices of at least one of the two types of sub-pixel in series allows the drive voltages of the OLEDs of the sub-pixels to be better balanced, thus reducing losses in the driver for the pixel taken as a whole. Typically the display is a multi-color display device and the first and second types of OLED material have emission peaks at different wavelengths so that the sub-pixels comprise, for example, red and/or green and/or blue sub-pixels. The selection of which sub-pixels to connect in series may be determined by the drive voltage of the materials from which the OLEDs of the sub-pixels are fabricated. Thus where the first type of OLED material has a lower drive voltage than the second type of OLED material the first types of sub-pixel may comprise series-connected OLED devices. Although separate drive lines to each sub-pixel could be employed preferably a pixel has a common power supply line (and preferably a common ground line) for supplying power to the at least two sub-pixels; typically common power and ground lines are provided for all the pixels of the display. In a typical configuration each sub-pixel has an associated drive transistor, for example to provide a current drive to the sub-pixel, connected between the one or more OLED devices of the sub-pixel and/or the (common) pixel power supply line.

In a preferred embodiment a pixel comprises three sub-pixels of different types, that is preferably having different peak emission wavelengths, to provide a color display. Thus the display may comprise a third sub-pixel type including a third type of OLED material, and in this case at least two of the sub-pixel types may comprise a plurality of series-connected OLED devices. Preferably the series connected devices of any one sub-pixel have substantially the same light-emissive area as one other. In this way a given sub-pixel light emitting area may have substantially the same light output whether or not series-connected devices are employed, thus simplifying design of the display device (although in some embodiments series-connected devices of different areas may be employed). The light emitting areas of the two (or three) types of sub-pixel may, however, be different. For example red sub-pixels may be smaller than green or blue sub-pixels because green/blue emissive materials tend to have shorter lifetimes than red-emissive materials so that by shrinking the red-emitting area and driving red sub-pixels harder substantially the same amount of perceived red brightness may be achieved whilst providing a finer pixel pitch and/or balancing sub-pixel lifetimes.

The first type of OLED material may comprise a fluorescent material and the second type of OLED material a phosphorescent OLED material. In another arrangement the first type of OLED material may comprise a polymer material and the second type of OLED material a dendrimer-based or small-molecule based material.

The invention further provides an active matrix color display incorporating the above-described OLED display device.

In a further aspect the invention provides a color active matrix OLED display having a plurality of pixels, each pixel comprising a red, green and blue sub-pixel powered from a common supply line and having an associated sub-pixel driver transistor, at least one of said red, green and blue sub-pixels comprising two or more series connected organic light emitting diodes (OLEDs).

Preferably the power requirements of said red, green and blue sub-pixels are balanced such that a power requirement of a said pixel including said associated sub-pixel driver transistors, with said red, green and blue sub-pixels illuminated, is less than a power requirement a said pixel would have for substantially the same perceived brightness were none of said sub-pixels to comprise series-connected OLEDs.

The invention also provides a method of designing an organic light emitting diode (OLED) display device, the display device having a plurality of pixels each comprising at least two sub-pixels of different types, a first sub-pixel type comprising an OLED device including a first type of OLED material and a second sub-pixel type comprising an OLED device including a second type of OLED material, and wherein at least one of said first and second types of sub-pixel comprises a plurality of series-connected OLED devices, the method comprising selecting whether said first and second types of sub-pixel comprise series-connected OLED devices dependent upon a drive voltage for a said OLED device of a said sub-pixel.

BRIEF DESCRIPTION OF THE DRAWINGS

These and other aspects of the invention will now be further described, by way of example only, with reference to the accompanying figures in which.

DETAILED DESCRIPTION

Figure 1:
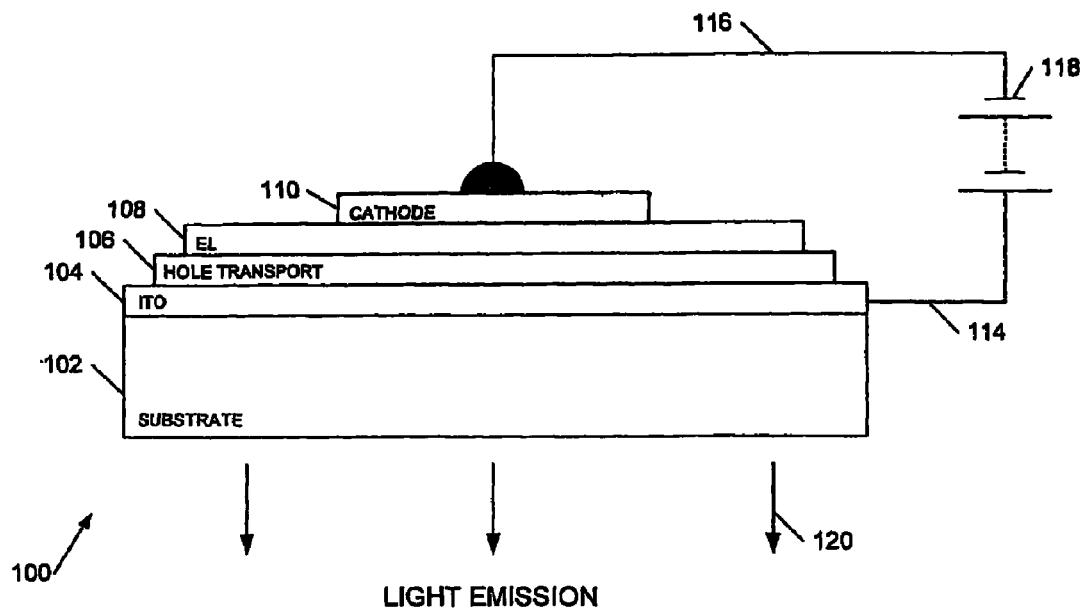
FIG. 1 shows a basic OLED structure.
Figure 2A:
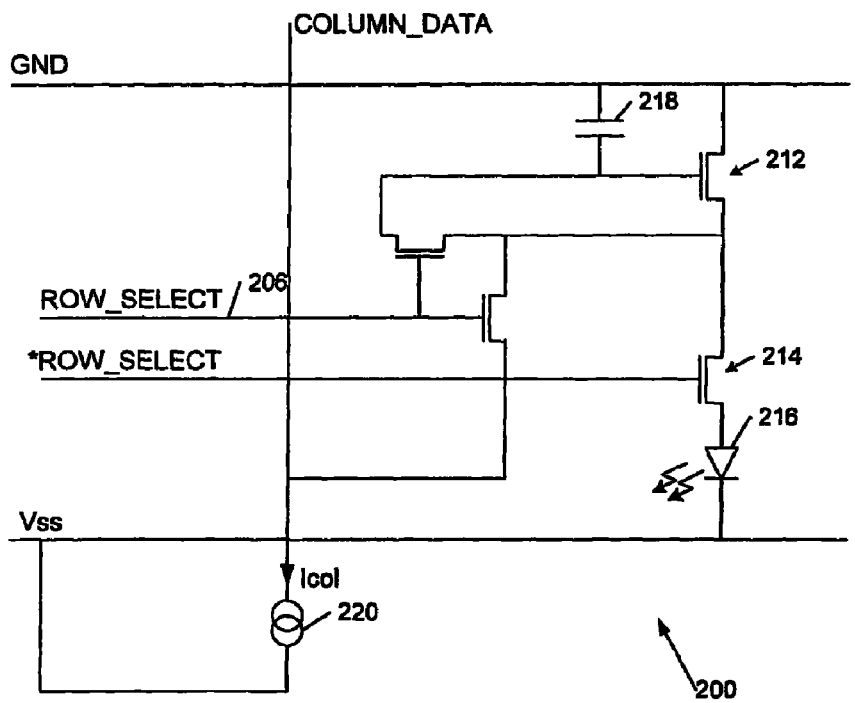
FIGS. 2a and 2b show, respectively, a current-controlled OLED driver circuit and an active matrix OLED display and driver.
Figure 2B:
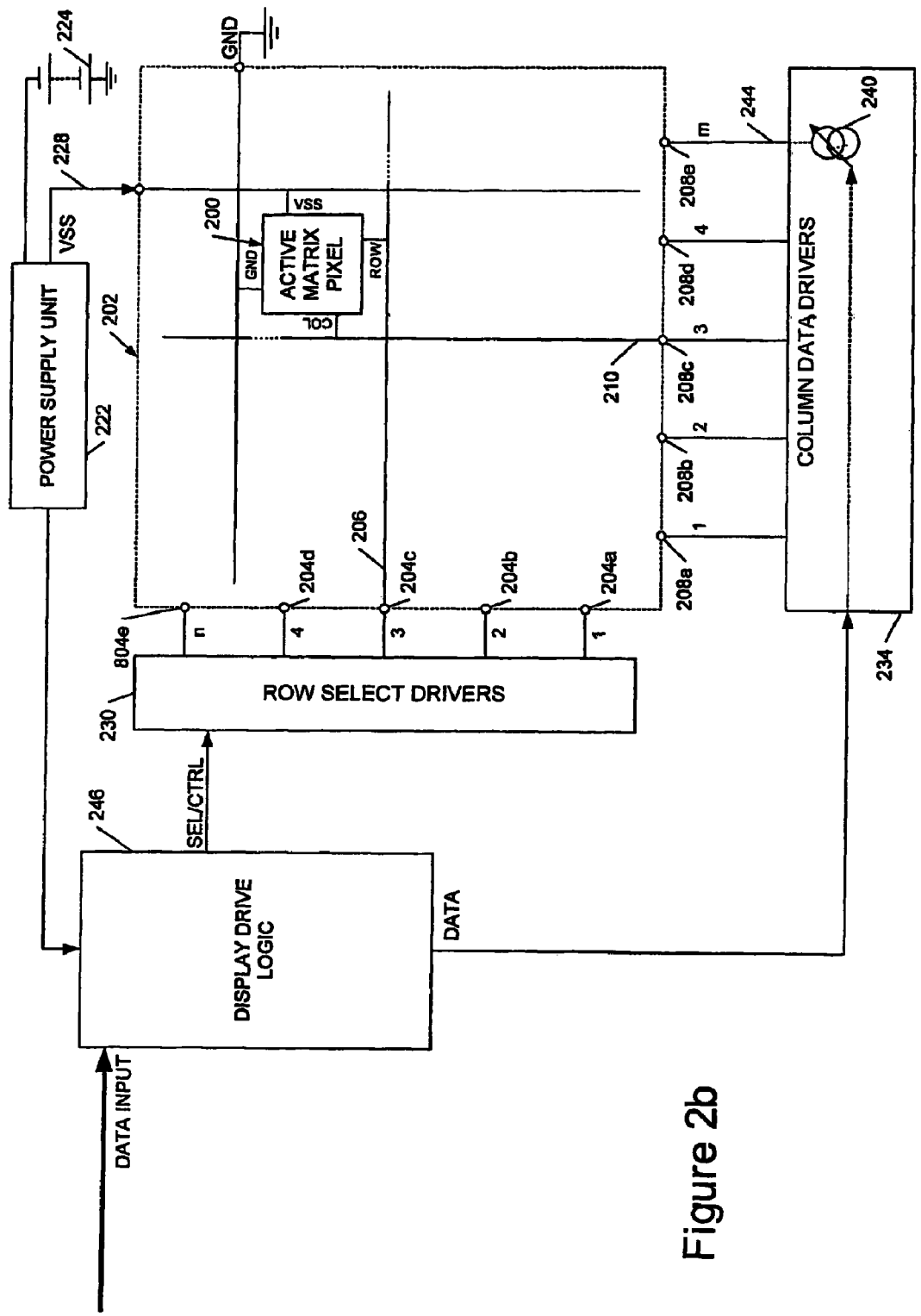
Figure 3A:
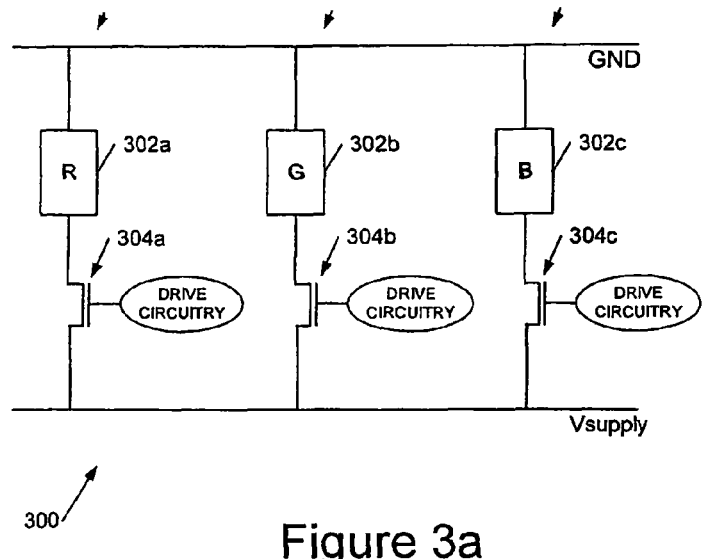
FIGS. 3a to 3c show, respectively, a circuit model of a pixel of a color active matrix OLED display, a front view of a color OLED display, and an enlarged view of a pixel of the display of FIG. 3b.
Figure 3B:
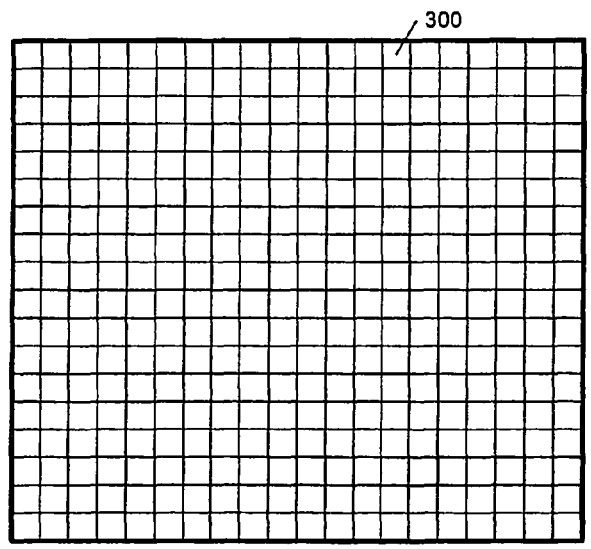
Figure 3C:
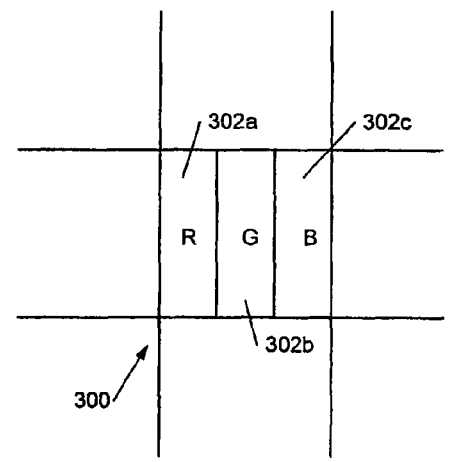
Figure 4:
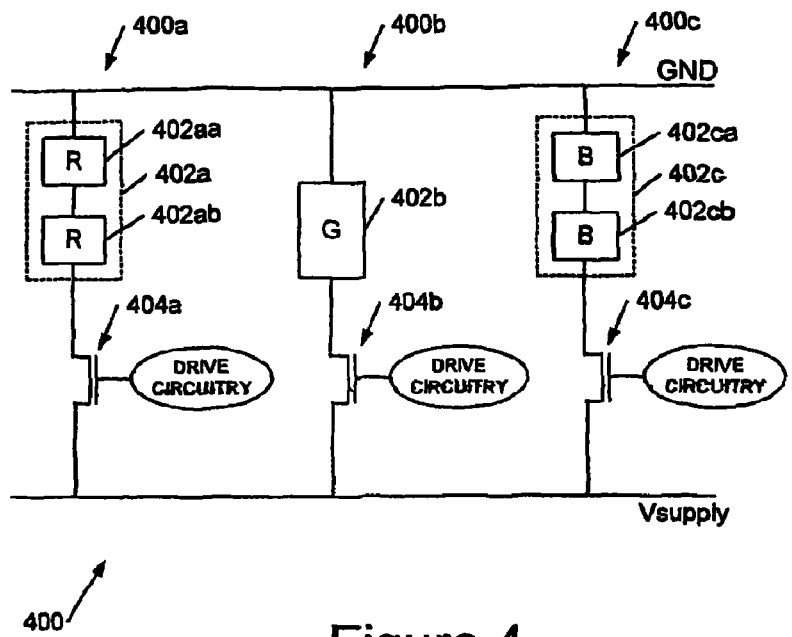
FIG. 4 shows a circuit model of a pixel of a color active matrix OLED display in accordance with an embodiment of the invention.

FIG. 4 shows a circuit model 400 of a pixel of a color active matrix OLED display in which a red sub-pixel 402a employs a red-emitting phosphorescent dendrimer-based OLED material with a drive voltage of approximately three volts, a green sub-pixel 402b employs a green-emitting phosphorescent dendrimer-based OLED material with a drive voltage of approximately seven volts, and a blue sub-pixel 402c employs a blue-emitting fluorescent polymer-based OLED material with a drive voltage of approximately four volts. Each sub-pixel 402a, b, c has a respective associated drive transistor 404a, b, c, as described above with reference to FIG. 3a, for providing a controlled current drive for each sub-pixel. Sub-pixel 402a comprises a pair of red-emitting series connected OLED devices 402aa, 402ab and, likewise, sub-pixel 402c comprises a pair of blue-emitting series-connected OLED devices 402ca, 402cb. The total emissive area of devices 402aa, 402ab and of devices 402ca, 402cb preferably corresponds to the light emitting area which would have been employed were series-connected devices not employed, that is as shown in FIG. 3a (provided that the same total light output as for the FIG. 3a arrangement is desired).

Each of the series-connected devices 402aa, 402ab, 402ca, 402cb requires a full drive voltage across it for full illumination and thus for n series-connected OLED devices a drive voltage of $nV_{drive}$ is required, where $V_{drive}$ is the drive voltage for one of the devices. However the current required for a given light output is reduced by a factor n (which can be understood by appreciating that a single electron passing through say two series-connected devices generates two photons rather than one). Thus the total power drawn by the series-connected devices is, for the same light output, substantially unchanged.

Merely connecting two OLED devices in series provides some power saving. This can be seen by considering the example of a red-emitting device with a drive voltage of three volts, controlled by a thin film drive transistor which drops approximately four volts. For this case approximately 57% of the power is dissipated in the drive transistor, but if two red-emitting devices are connected in series so that the total drive voltage is six volts then only 40% of the total power is dissipated in the drive transistor (which still drops 4 volts), and with four series connected devices (12 volts drive voltage) only 25% of the power is dissipated in the drive transistor. However further savings can be achieved for a color display by balancing the drive voltages required for the individual sub-pixels.

Figure 5A:
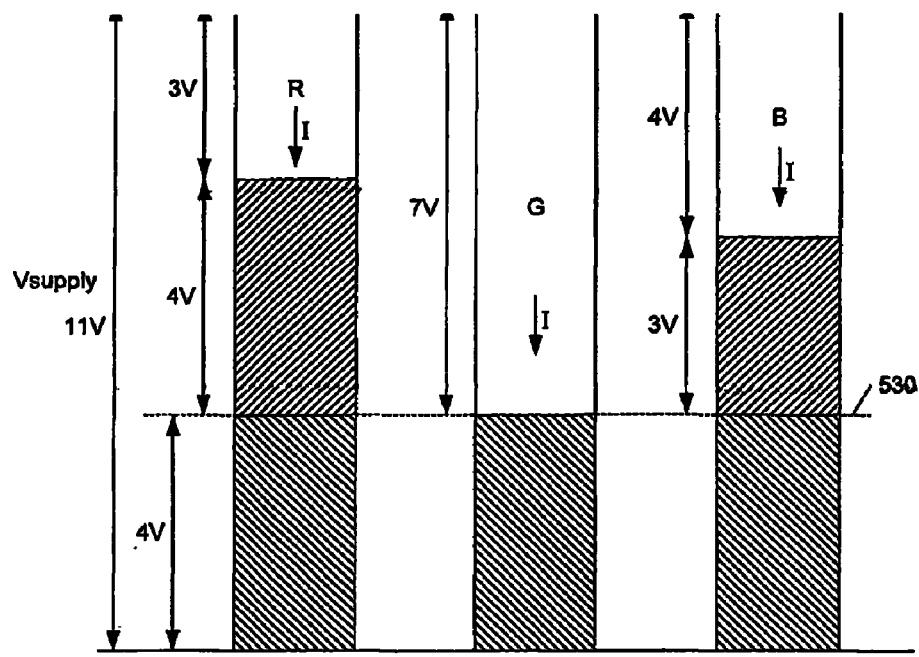
FIGS. 5a and 5b illustrate power losses for the circuit models of FIGS. 3a and 4 respectively.
Figure 5B:
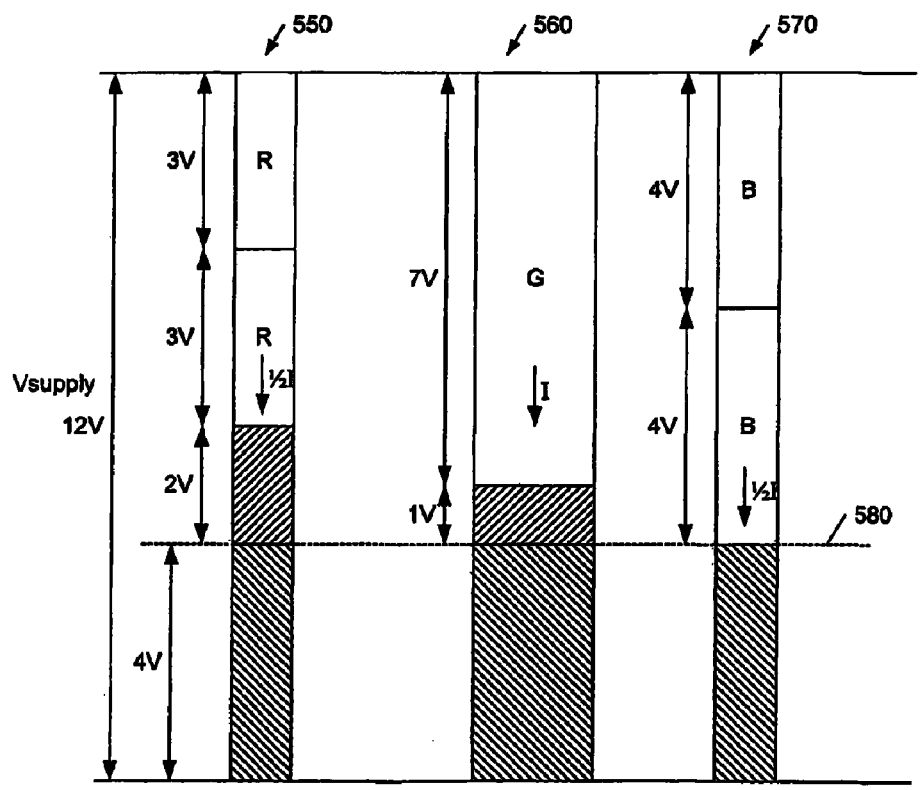

FIGS. 5a and 5b illustrate power losses for the circuit models of FIGS. 3a and 4 respectively. Each of FIGS. 5a and 5b depicts three bars 500, 510, 520 and 550, 560, 570, which represent power dissipation in the red, green, and blue sub-pixels respectively. For simplicity it is assumed the same current density, J, in each sub-pixel but since current flows between top and bottom electrodes of an OLED device, when the lateral, light-emitting area is, say, halved the current through the device is also halved. In FIGS. 5a and 5b the current though a sub-pixel is represented by the width of a bar so that it can be seen that for the red and blue sub-pixels the current for FIGS. 4/5b is halved as compared with the configuration represented by FIGS. 3a/5a.

In FIG. 5a, the current in each sub-pixel is I, the total supply voltage is 11 volts, and for each of the sub-pixels (4 volts).I is dissipated in the thin film drive transistor ($V_{TFT}$), as indicated by dashed line 530 (and similarly by dashed line 580 in FIG. 5b). In the green sub-pixel of FIG. 5a there is no additional wasted power but in the red sub-pixel there is 4.I additional wasted power, and in the blue sub-pixel 3.I additional wasted power, making a total of 7.I additional wasted power. By contrast in FIG. 5b the supply voltage is 12 volts and in the blue sub-pixel (bar 570) there is no additional wasted power, in the green sub-pixel there is 1.I additional wasted power, and in the red sub-pixel 2.(½I) additional wasted power, making a total of 2.I additional wasted power for substantially the same light output. There is also only 8.I power dissipation in the driver transistors, as compared with 12.I for FIG. 5a.

Another example as is shown in Table 1, below. This relates to a 250 cd/m² display (before an output circular polarizer) with a total aperture ratio of 40%, equally shared between red, green and blue sub-pixels. For the OLED materials of table 1 a red sub-pixel has a drive voltage of 3.6 volts, a green sub-pixel a drive voltage of 4.2 volts and a blue sub-pixel a drive voltage of 5.15 volts. The efficiencies of the red, green and blue sub-pixels, in candelas per amp at the drive voltage, are given in the second row of the table (this varies only slowly with the drive voltage). The third row of the table gives a drive current density, $J_d$, for the pixels in amps per metre squared, and the bottom row of the table shows the perceived brightness (in a given viewing direction) of the sub-pixels in candelas per meter squared. In this example we will assume that the driver transistor compliance and other power supply losses require a power supply voltage overhead of +1 volt so that the power supply voltage must be at least 6.15 volts to effectively drive the blue sub-pixels. The total power per unit area drawn by the display when all pixels are on (that is all sub-pixels are fully illuminated) is given by the supply voltage multiplied by the current density for each pixel, multiplied by the aperture ratio. In the example of table 1 the total power per unit area is given by Total power=(151+98.5+72.5)*(5.15+1.0)*(0.4/3)

that is approximately 260 W/m², or 16 W for a typical 14 inch diagonal display.

TABLE 1

| | Color | | |
|---|---|---|---|
| | R | G | B |
| Vdrive | 3.6 | 4.2 | 5.15 |
| cd/A | 2.2 | 10.6 | 6.6 |
| A/m² | 151 | 98.5 | 72.5 |
| cd/m² | 328 | 1034 | 481 |

In the above example if, with the same RGB materials, two devices in series are used for the green and blue sub-pixels and three for the red sub-pixel (because the drive voltage of the red material is so much lower) the configuration and parameters defined by table 2 below result.

TABLE 2

| | Color | | |
|---|---|---|---|
| | R | G | B |
| Vdrive | 10.8 | 8.4 | 10.3 |
| cd/A | 6.5 | 21.0 | 13.3 |
| A/m² | 50 | 49 | 36 |
| cd/m² | 328 | 1034 | 481 |

Assuming the same voltage overhead of +1.0 volts, the total power per unit area is now given by:

Total power=(50+49+36)*(10.8+1.0)*(0.4/3)

that is approximately 212 W/m², or approximately 13 W for a typical 14 inch display, thus demonstrating a small but significant power saving.

As well as the above described power savings the reduced drive current also enables smaller drive transistors to be employed, thus potentially increasing the aperture ratio of a display. Smaller drive currents may also reduce damage in the drive transistors thus increasing the lifetime of these devices.

Figure 6:
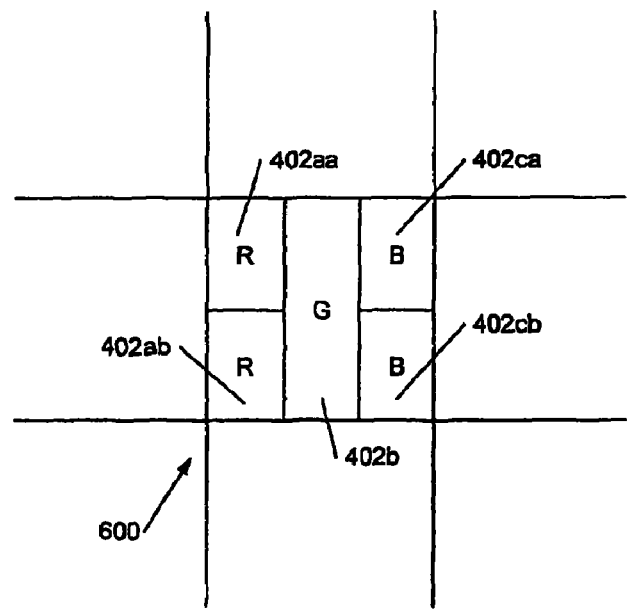
FIG. 6 shows a portion of a color active matrix OLED display showing a light-emitting face of a pixel fabricated according to the circuit model of FIG. 4.

FIG. 6 shows an enlarged view of a pixel 600 corresponding to the circuit model 400 of FIG. 4. As can be seen the pixel comprises an adjacent pair of red-emitting OLEDs 402aa, 402ab, and an adjacent pair of blue-emitting OLEDs 402ca, 402cb, in addition to a single green-emitting device 402b (for simplicity the drive circuitry has been omitted).

It will be appreciated that although devices 402aa, 402ab are adjacent one another they are connected in series so that the anode of one is connected to the cathode of the other. This may be accomplished by forming patterned metallization layers within the device, for example using the cathode metal. Such cathode layers may be deposited by physical vapor deposition, using a first shadow mask for the calcium and a second shadow mask for the aluminum. Mutual electrical isolation of cathode lines may be improved by the use of cathode separators, that is a raised bank of material, such as patterned photoresist, between the cathode lines. Vias may be formed to connect the anode of one device to the cathode of another by selectively removing organic OLED material prior to deposition of a subsequent (cathode metal) metallization layer. This may be done by laser ablation, or by selective deposition of the organic material, for example using an ink-jet based deposition process.

The skilled person will appreciate that a series-connected sub-pixel configuration for one or more sub-pixels of a pixelated, multi-color display may be employed for both top-emitting displays (that is displays which emit through the cathode) and bottom-emitting displays (that is displays which emit through the anode).

Although embodiments of the invention have been described with reference to active matrix displays, aspects of the invention also have applications in passive matrix displays where the drive circuitry is separate from the display rather than alongside each (sub-)pixel.

No doubt many other effective alternatives will occur to the skilled person and it will be understood that the invention is not limited to the described embodiments and encompasses modifications apparent to those skilled in the art lying within the spirit and scope of the claims appended hereto.

The invention claimed is:

1. An organic light emitting diode (OLED) display device, the display device having a plurality of pixels each comprising at least two sub-pixels of different types, a first sub-pixel type comprising an OLED device including a first type of OLED material and a second sub-pixel type comprising an OLED device including a second type of OLED material, wherein the OLED device including said first type of OLED material has a lower drive voltage than the OLED device including said second type of OLED material and a said pixel has a common power supply line for supplying power to said at least two sub-pixels, and wherein the first and second sub-pixel types comprise different number of series connected devices.

2. An OLED display device as claimed in claim 1 wherein each of said series connected devices of a given type has substantially the same light emissive area.

3. An OLED display device as claimed in claim 1 wherein said first and second types of OLED material have different peak emission wavelengths.

4. An OLED display device as claimed in claim 1 wherein a said pixel comprises three sub-pixels of different types, a said pixel including a third sub-pixel type comprising an OLED device including a third type of OLED material.

5. An OLED display device as claimed in claim 4 wherein at least two of said sub-pixel types comprise a plurality of series-connected OLED devices.

6. An OLED display device as claimed in claim 1 further comprising a drive transistor associated with each sub-pixel.

7. An OLED display device as claimed in claim 1 wherein said first type of OLED material comprises a fluorescent material.

8. An OLED display device as claimed in claim 7 wherein said second type of OLED material comprises a phosphorescent OLED material.

9. An OLED display device as claimed in claim 1 wherein said first type of OLED material comprises a polymer material.

10. An OLED display device as claimed in claim 9 wherein said second type of OLED material comprises a dendrimer OLED material or small molecule OLED material.

11. An active matrix color display incorporating the display device of claim 1.

* * * * *

UNITED STATES PATENT AND TRADEMARK OFFICE
CERTIFICATE OF CORRECTION

PATENT NO. : 7,956,531 B2
APPLICATION NO. : 10/587602
DATED : June 7, 2011
INVENTOR(S) : Euan C. Smith It is certified that error appears in the above-identified patent and that said Letters Patent is hereby corrected as shown below:

At Column 2, line 35, "display device logic" should be -- display drive logic --.

At Column 4, line 67, "trust is preferably" should be -- preferably --.

At Column 7, line 25, "as is" should be -- is --.

At Column 7, line 30, two occurrences of "sub-pixel a" should be -- sub-pixel has a --.

At Column 9, line 7, "number" should be -- numbers --.

Signed and Sealed this
Twelfth Day of February, 2013

Teresa Stanek Rea
*Acting Director of the United States Patent and Trademark Office*